(12) United States Patent
Sasaki

(10) Patent No.: US 6,335,611 B1
(45) Date of Patent: Jan. 1, 2002

(54) CURRENT MONITORING CIRCUIT FOR SECONDARY BATTERY

(75) Inventor: Manabu Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/625,720

(22) Filed: Jul. 26, 2000

(30) Foreign Application Priority Data

Jul. 30, 1999 (JP) ............................................ 11-216553

(51) Int. Cl.$^7$ ................................................. H02J 7/00
(52) U.S. Cl. ...................................... 320/134; 320/128
(58) Field of Search ................................ 320/134, 128, 320/127, 132, 151, 152

(56) References Cited

U.S. PATENT DOCUMENTS 6,031,302 A * 2/2000 Levesque ..................... 320/134
6,172,481 B1 * 1/2001 Curtiss ........................ 320/127

* cited by examiner

*Primary Examiner*—Peter S. Wong
*Assistant Examiner*—Lawrence Luk
(74) *Attorney, Agent, or Firm*—Arent Fox Kintner Plotkin & Kahn, PLLC

(57) ABSTRACT

A current monitoring circuit for monitoring a charging/discharging current of a secondary battery that achieves high-precision monitoring and that restricts an increase in the circuit scale. An amplifier amplifies a voltage of a current sense resistor generated by a charging/discharging current under a various amplification degrees. A comparator compares an output voltage of the amplifier with a reference voltage. A controller controls a reference voltage to be supplied to each unit and controls the amplification degree of the amplifier, based on a result of the comparison. An A/D converter A/D converts an output voltage of the amplifier. A numerical-value converter converts a digital value obtained by the conversion of the A/D converter into a numerical value corresponding to a charging/discharging current, under the control of the controller. When an excess current has been detected, a switch is set to a non-conductive state, to thereby disconnect the battery from the external unit.

8 Claims, 14 Drawing Sheets

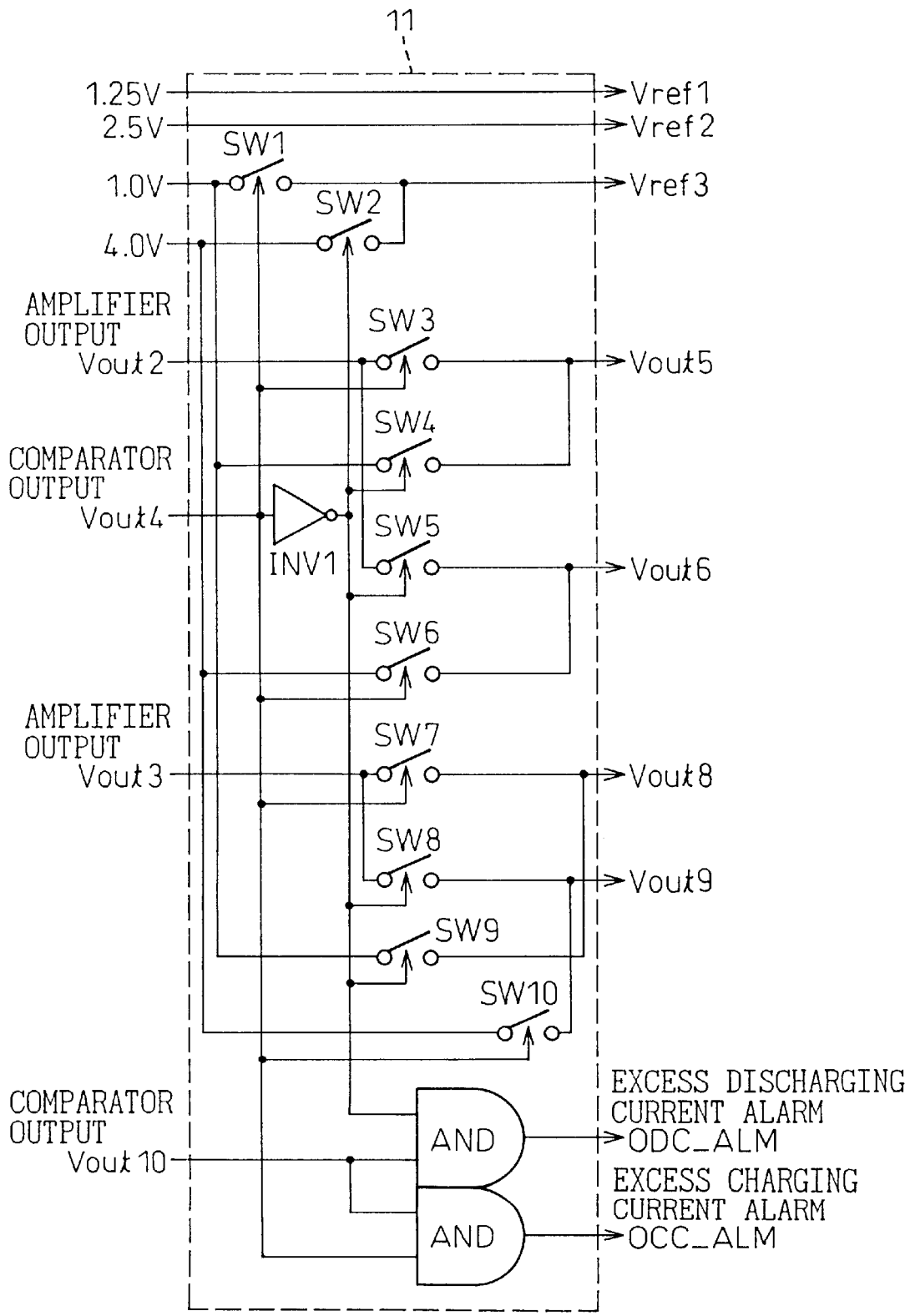

Fig. 8

(A) Vout5,6

| | Vout 2 | Vout 4 | SW3 | SW4 | SW5 | SW6 | Vout 5 | Vout 6 |
|---|---|---|---|---|---|---|---|---|
| DURING CHARGING | >2.5V | H | ON | OFF | OFF | ON | Vout2 | 4.0V |
| DURING DISCHARGING | <2.5V | L | OFF | ON | ON | OFF | 1.0V | Vout2 |

(B) Vout7

| | Vout2 | Vout4 | RELATIONSHIP BETWEEN Vout5 AND Vout6 | Vout7 |
|---|---|---|---|---|
| DURING SMALL CHARGING | >2.5V | H | Vout2 < 4.0V | L |
| DURING LARGE CHARGING | >2.5V | H | Vout2 > 4.0V | H |
| DURING SMALL DISCHARGING | <2.5V | L | 1.0V < Vout 2 | L |
| DURING LARGE DISCHARGING | <2.5V | L | 1.0V > Vout 2 | H |

(C) Vout8,9

| | SW7 | SW8 | SW9 | SW10 | Vout8 | Vout9 | ALARM |
|---|---|---|---|---|---|---|---|
| DURING CHARGING | ON | OFF | OFF | ON | Vout3 | 4.0V | EXCESS CHARGING CURRENT |
| DURING DISCHARGING | OFF | ON | ON | OFF | 1.0V | Vout3 | EXCESS DISCHARGING CURRENT |

Fig.9

(A) RELATIONSHIP BETWEEN VOLTAGE INPUT TO A/D CONVERTER AND CHARGING/DISCHARGING CURRENT

|  | 4.0V | 2.5V | 1.0V |
|---|---|---|---|
| ① SMALL CHARGING/DISCHARGING CURRENT | CHARGING 2.5A | 0A | DISCHARGING 2.5A |
| ② LARGE CHARGING CURRENT | CHARGING 10A | CHARGING 5A | 0A |
| ③ LARGE DISCHARGING CURRENT | 0A | DISCHARGING 5A | DISCHARGING 10A |

(B) 8-BIT OUTPUT OF DIGITAL VALUE OF A/D CONVERTER

|  | 4.0V | 2.5V | 1.0V |
|---|---|---|---|
| ④ SMALL CHARGING/DISCHARGING CURRENT | 1111_1111 | 1000_0000 | 0000_0000 |
| ⑤ LARGE CHARGING CURRENT | 1111_1111 | 1000_0000 | 0000_0000 |
| ⑥ LARGE DISCHARGING CURRENT | 1111_1111 | 1000_0000 | 0000_0000 |

(C) 9-BIT CONVERSION OF NUMERICAL-VALUE CONVERTER

| Vout4 | Vout7 | MONITORING MODE | EXAMPLE OF CONVERSION RESULT (Vout4 BECOMES MSB) |
|---|---|---|---|
| H | L | SMALL CHARGING CURRENT | 1_00_6 BITS EXCLUDING MSB AND LSB OF ④ |
| H | H | LARGE CHARGING CURRENT | 1_⑤ |
| L | L | SMALL DISCHARGING CURRENT | 0_11_1's COMPLEMENT OF 6 BITS EXCLUDING MSB AND LSB OF ④ |
| L | H | LARGE DISCHARGING CURRENT | 0_⑥ |

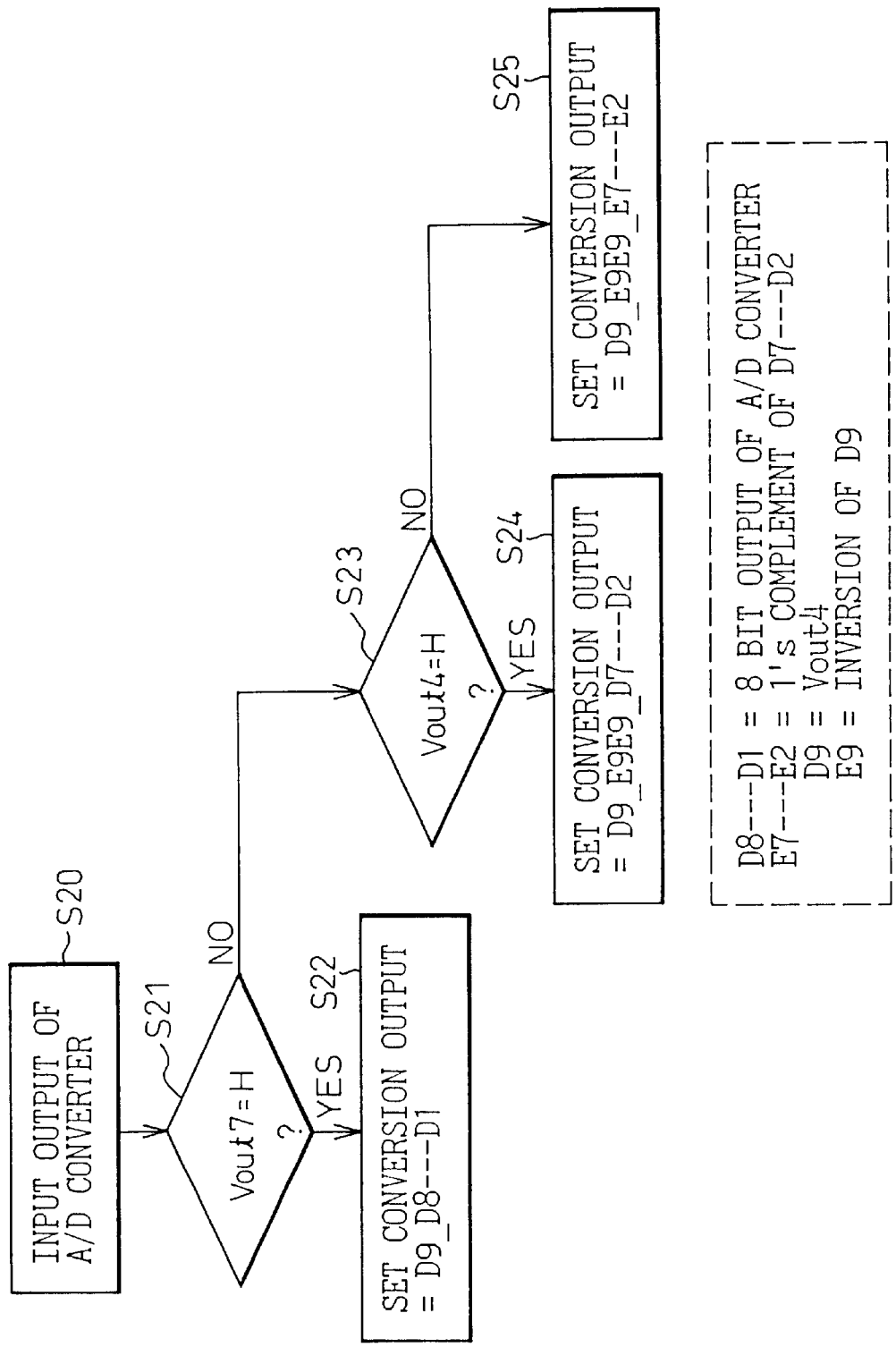

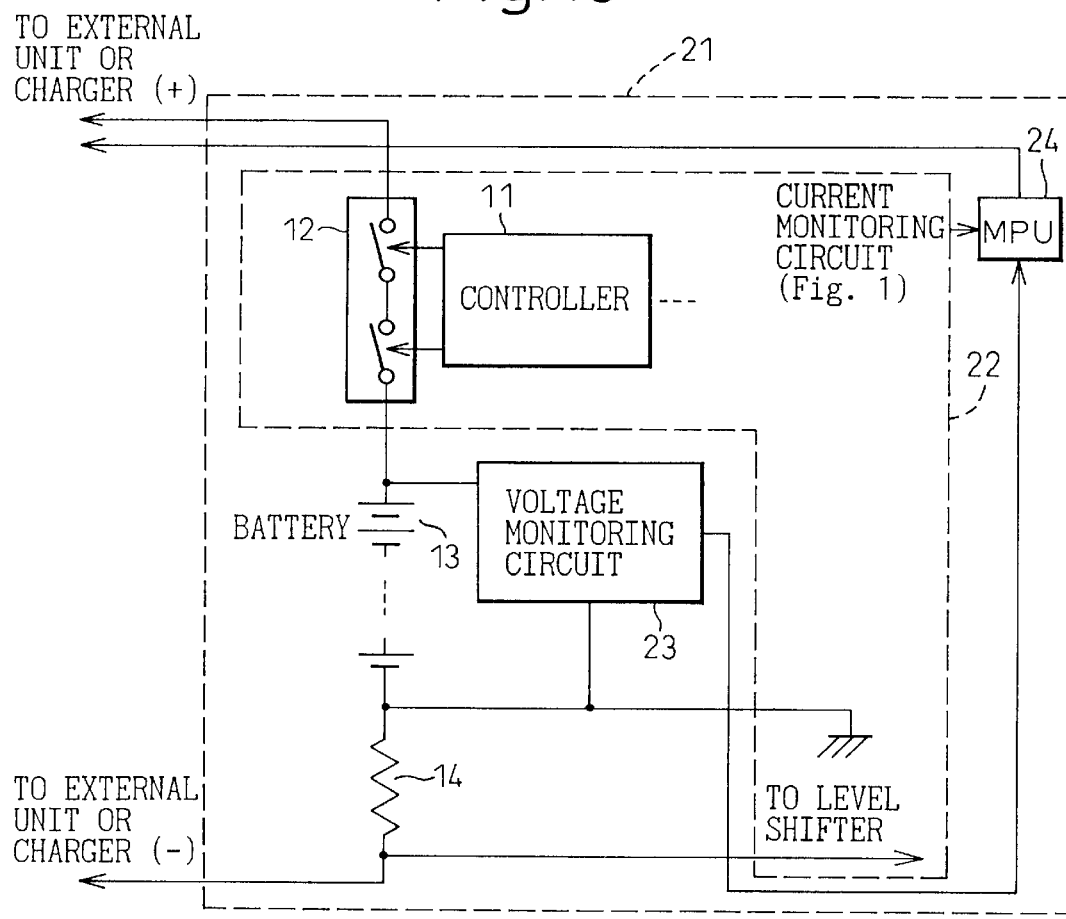

CURRENT MONITORING CIRCUIT FOR SECONDARY BATTERY

BACKGROUND OF THE INVENTION

1. Field of the Invention

The present invention relates to a current monitoring circuit for a chargeable/dischargeable secondary battery, and relates, more particularly, to a current monitoring circuit for monitoring a charging/discharging current of a secondary battery incorporated in a portable information terminal.

2. Description of the Related Art

In recent years, along with standardization of power source management for portable information terminal, there has been required a high-precision detection of the remaining capacity of a secondary battery. Therefore, it is necessary to monitor with high precision a charging/discharging current that flows to a secondary battery.

In a conventional portable information terminal incorporating a secondary battery, a voltage generated by a charging/discharging current flowing through a current sensing resistor connected in series with the battery or an ON resistance of an FET (Field Effect Transistor) provided for interrupting a charging/discharging route, is amplified, and this voltage is analog/digital (A/D) converted. The A/D converted signal is calibrated by a microprocessor (MPU) or the like.

In the monitoring of a charging/discharging current, when only an amplifier circuit for monitoring a large charging/discharging current is used, it is not possible to monitor a small charging/discharging current with high precision because of limits in the input range and the resolution of the A/D converter. On the other hand, when an attempt is made to achieve high-precision monitoring of a charging/discharging current by using amplifier circuits of different amplification degrees for monitoring a large current charging, a large current discharging, a small current charging/discharging current respectively, there is a problem of an increase in the circuit scale.

In other words, according to the conventional current monitoring circuit, when an increase in the circuit scale is restricted, it is not possible to monitor a current with high precision. As a result, there occurs an error in the battery remaining capacity valve. On the other hand, when a plurality of amplifier circuits of different amplification degrees are used, there is a problem of increase in the circuit scale, which results in a high-cost current monitoring circuit.

SUMMARY OF THE INVENTION

In order to solve the above problems, it is an object of the present invention to provide a high-precision and low-cost charging/discharging current monitoring circuit for a secondary battery.

According to the present invention, there is provided a current monitoring circuit for a secondary battery, comprising: a current detector detecting a current during a charging and a discharging of a secondary battery, and outputting a voltage signal according to a detected current; an amplifier having an amplification degree that can be changed and amplifying the voltage signal output from the current detector at a suitable amplification degree obtained by changing the amplification degree; an A/D converter for converting an output of the amplifier into a digital signal; and a numerical-value converter converting the digital signal output from the A/D converter according to an amplification degree of the amplifier, to thereby output a digital value indicating a current during the charging and the discharging of the secondary battery.

BRIEF DESCRIPTION OF THE DRAWINGS

FIG. 7 is a diagram showing an example of structure of a controller.

FIGS. 8(A), 8(B), and 8(C) are diagrams for explaining an example of an operation of the comparator and the controller.

FIGS. 9(A), 9(B), 9(C) are diagrams for explaining an A/D converter and a numerical-value converter.

FIG. 10 is a flowchart showing a conversion method of the numerical-value converter.

FIG. 15 is a total block diagram showing one example of a battery pack to which the present invention is applied.

DETAILED DESCRIPTION OF THE PREFERRED EMBODIMENTS

Embodiments of the present invention will be explained in detail below with reference to the drawings.

Figure 1:
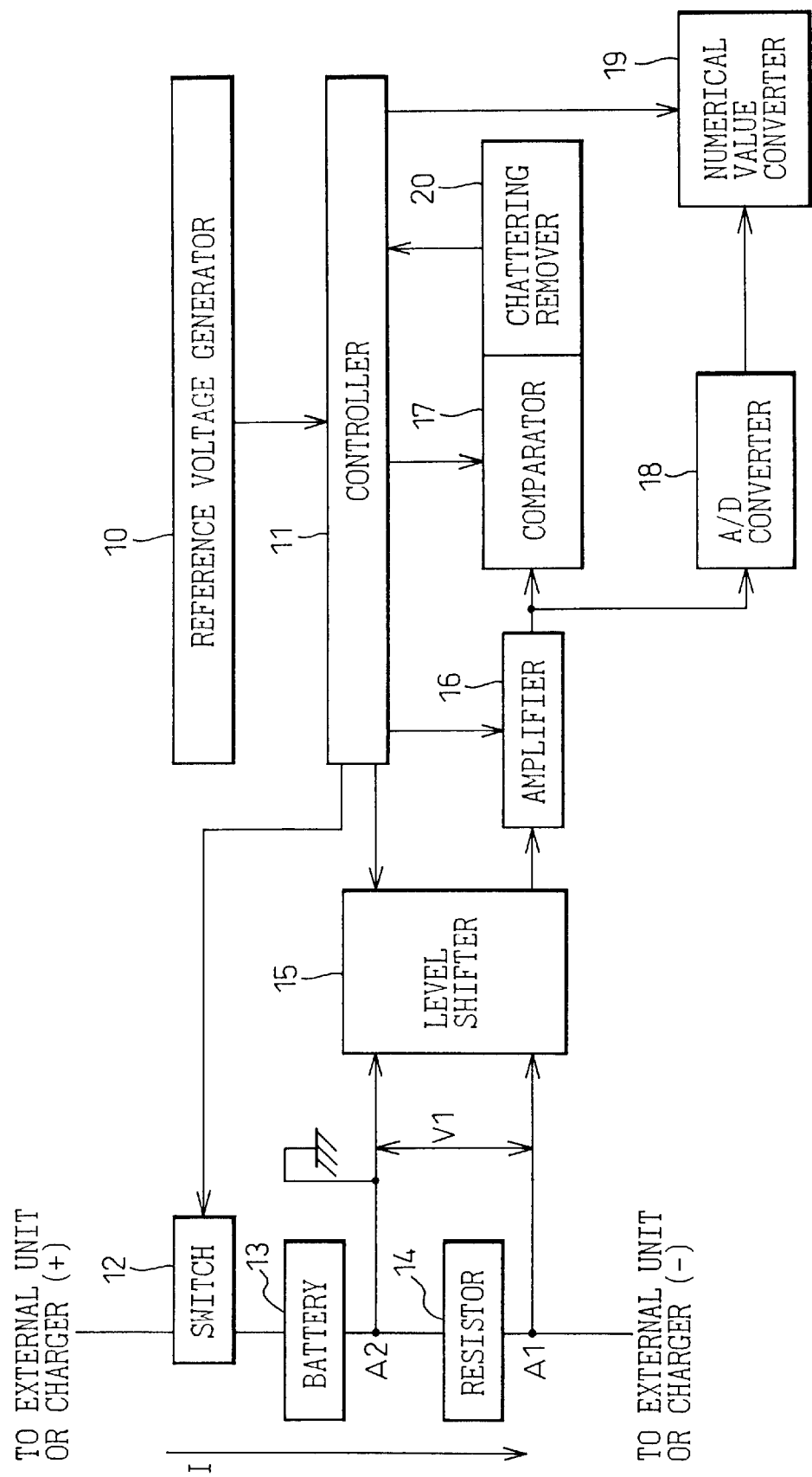
FIG. 1 is a block diagram showing a current monitoring circuit according to an embodiment of the present invention.

FIG. 1 shows a circuit for monitoring a current of a chargeable/dischargeable battery 13. A current sense resistor 14 is connected in series with the battery 13. A level shifter 15 shifts a DC level of a voltage V1 to within an operation range of an amplifier 16 at a later stage, the voltage V1 being generated when a charging/discharging current flows through current sense resistor 14. The level shifter 15 is not necessary when the amplifier 16 can handle the voltage V1 as an input voltage.

The amplifier 16 has a function of amplifying a voltage supplied from the level shifter 15 or the voltage V1 by a plurality of amplification degrees. A comparator 17 compares a voltage supplied from the amplifier 16 with a reference voltage. An A/D converter 18 converts a voltage supplied from the amplifier 16 from an analog value into a digital value. A numerical-value converter 19 converts a digital value obtained from the A/D converter 18 into a numerical value corresponding to a charging/discharging current.

A reference voltage generator 10 is a circuit for generating a predetermined reference voltage to be used in the amplifier 16, the comparator 17, etc. A controller 11 controls a reference voltage to be supplied to each unit, controls an amplification degree of the amplifier 16, and controls the numerical-value converter 19 that converts an output of the A/D converter 18 into a numerical value corresponding to a charging/discharging current.

The comparator 17 compares an output voltage of the amplifier 16 with the reference voltage. Based on a result of the comparison, the controller 11 changes the amplification degree of the amplifier 16. With this arrangement, it is possible to provide a high-precision current monitoring circuit in a smaller circuit.

The controller 11 controls the amplifier 16, the comparator 17 and the numerical-value converter 19 to make it possible to monitor a small charging current, a small discharging current, a large charging current, a large discharging current, an excess charging current, and an excess discharging current, by changing over the monitoring according to the need.

A reference voltage generated by the reference voltage generator 10 is used by the amplifier 16 as the reference voltage for amplifying a small charging/discharging current and also used by the comparator 17 as the reference voltage for detecting charging/discharging. Other reference voltages are used as reference voltages for changing over an input of the A/D converter 18 between a small charging current, a small discharging current, a large charging current, a large discharging current, an excess charging current, and an excess discharging current. The latter reference voltages are also used by the amplifier 16 as a reference voltage for amplifying a large charging current and a large discharging current.

The sharing of the reference voltages by various units makes it possible to minimize the scale of the total circuit.

A switch 12 is used for conducting or interrupting a charging/discharging current route of the battery 13. When the comparator 17 has detected that a large charging current or a large discharging current has exceeded a monitoring range, the controller 11 lowers the amplification degree of the amplifier 16 to make it possible to monitor a larger current than the current monitoring range. Further, when the comparator 17 detects that a predetermined excess charging/discharging current is flowing, the controller 11 interrupts a charging route or a discharging route of the switch 12. When the comparator 17 detects that a predetermined excess charging/discharging current is not flowing, the controller 11 controls an interrupted charging route or an interrupted discharging route of the switch 12 to conduct a current.

Based on the above arrangement, the amplifier 16 can detect a charging/discharging of a small current with high precision. When the comparator 17 has detected an excess-charging current or an excess-discharging current, the switch 12 can protect the battery 13.

Each unit shown in FIG. 1 will be explained in detail with reference to the drawings.

Figure 2:
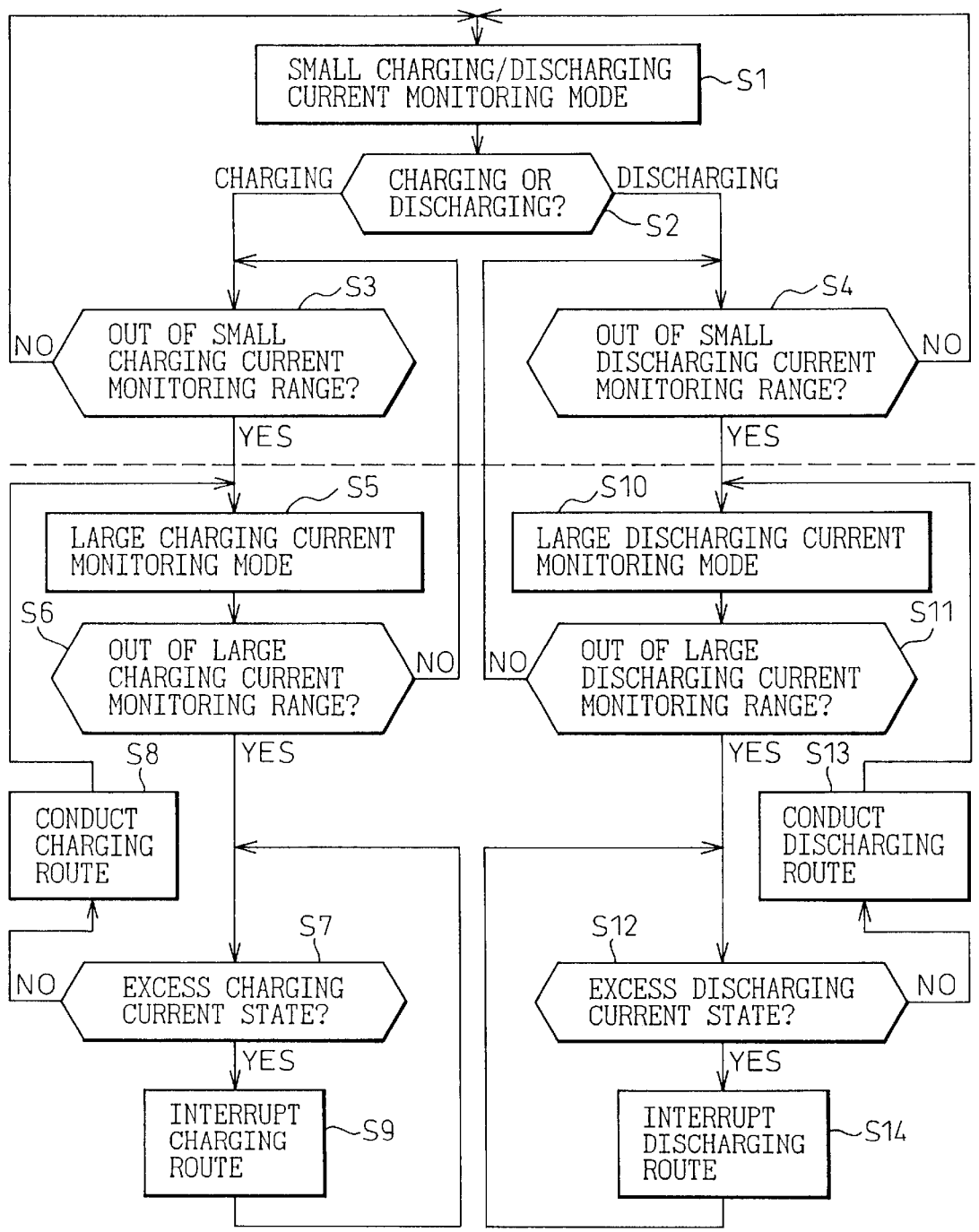
FIG. 2 is a flowchart showing an outline operation of the circuit shown in FIG. 1.

FIG. 2 shows an outline operation of the circuit shown in FIG. 1. It is assumed that the amplifier 16 is structured to be able to selectively use two amplification degrees for monitoring a small charging/discharging current and for monitoring a large charging/discharging current respectively. These amplification degrees are different between the upper part and the lower part of a dotted line shown in FIG. 2. A state of observing a small charging/discharging current is called a small charging/discharging current monitoring mode, and a state of observing a large charging/discharging current is called a large charging/discharging current monitoring mode.

It is assumed that a first monitoring mode is the small charging/discharging current monitoring mode (S1 in FIG. 2). In the case of charging (S2), a small charging current is monitored. When a current value has a value outside a range of monitoring a small charging current (S3), the monitoring mode shifts to a large charging current monitoring mode at a step S5. In the case of discharging (S2), a small discharging current is monitored. When a current value has a value outside a range of monitoring a small discharging current (S4), the monitoring mode shifts to a large discharging current monitoring mode at a step S10.

In the large charging current monitoring mode (S5), a large charging current is monitored. When a current has become a value not within a range of monitoring a large charging current (S6), the monitoring mode shifts to a small charging current monitoring mode. When a current value is within the range of monitoring a large charging current, it is checked whether the current is an excess-charging current or not (S7). When the current is not an excess charging current, the charging route of the switch 12 shown in FIG. 1 is maintained in the current conduction state (S8). On the other hand, when the current is an excess charging current, the switch 12 interrupts the flow of current through the charging route (S9) thereby to protect the battery 13 from the excess charging current.

In the large discharging current monitoring mode (S10), a large discharging current is monitored. When a current value has a value not within a range of monitoring a large discharging current (S11), the monitoring mode shifts to a small discharging current monitoring mode. When a current value is within the range of monitoring a large discharging current, it is checked whether the current is an excess-discharging current or not (S12). When the current is not an excess discharging current, the discharging route of the switch 12 shown in FIG. 1 is maintained in the current conduction state (S13). On the other hand, when the current is an excess discharging current, the switch 12 interrupts the flow of current through the discharging route (S14) thereby to protect the battery 13 from the excess discharging current.

It is assumed that the A/D converter 18 has an input voltage range of 1 V to 4 V in the circuit shown in FIG. 1. The current sense resistor 14 is assumed to have a resistance of 40 mΩ. It is also assumed that the range of monitoring a charging/discharging current in the present circuit is 10A for charging to 10A for discharging. Then, the voltage V1 across both ends of the current sense resistor 14 takes a range from −400 mV at 10A during a charging to +400 mV at 10A during a discharging. It should be noted that parameters of resistance and others explained here are taken as example values to simplify the explanation, and the present invention is not limited to these values.

Figure 3:
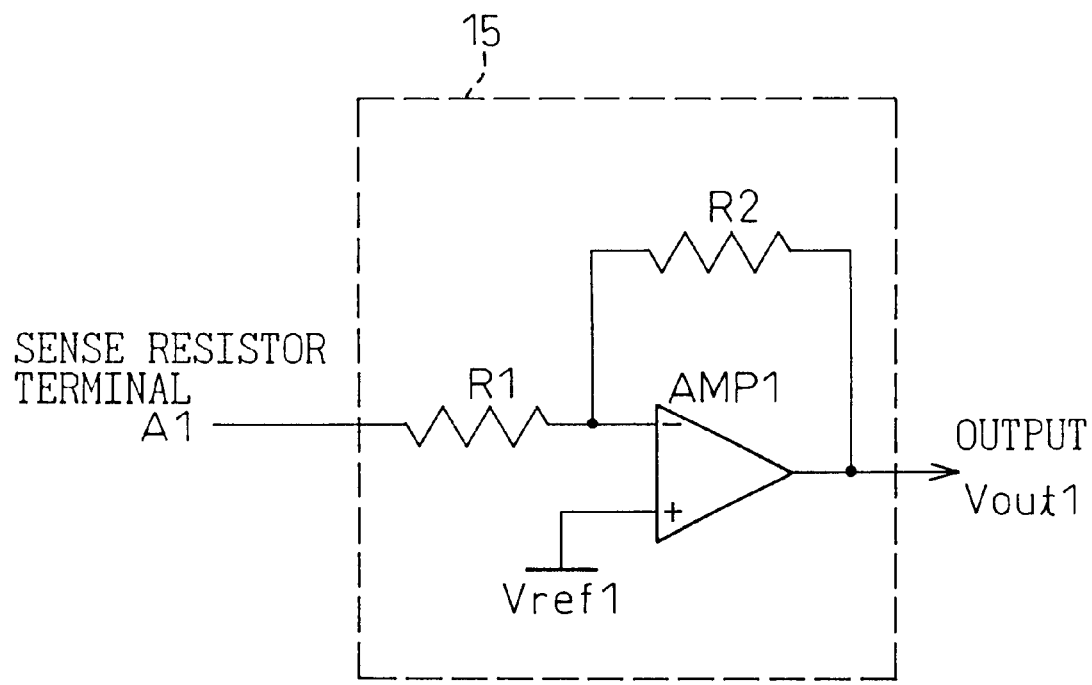
FIG. 3 is a diagram showing an example of structure of a level shifter.

FIG. 3 shows an example of structure of the level shifter 15 shown in FIG. 1. In FIG. 3, R1 and R2 denote resistors, and AMP1 denotes an operational amplifier. An input A1 of the level shifter 15 is a voltage that appears at a terminal not at the battery 13 of the current sense resistor 14. Assume, for example, that the resistors R1=R2=10 kΩ, and a reference voltage Vref1=1.25 V. It is also assumed that a charging/discharging current monitoring range is 10A for charging to 10A for discharging, and the current sense resistor 14 has a resistance of 40 mΩ, as described above. Then, a voltage at the input A1 takes a range from −400 mV at 10A for charging to +400 mV at 10A for discharging. In this case, an output Vout1 of the level shifter 15 takes a value of an inverted input voltage shifted to a plus direction by 2.5 V. Vout1 takes a range of 2.9 V at 10A for charging to 2.1 V at 10A for discharging.

Figure 4:
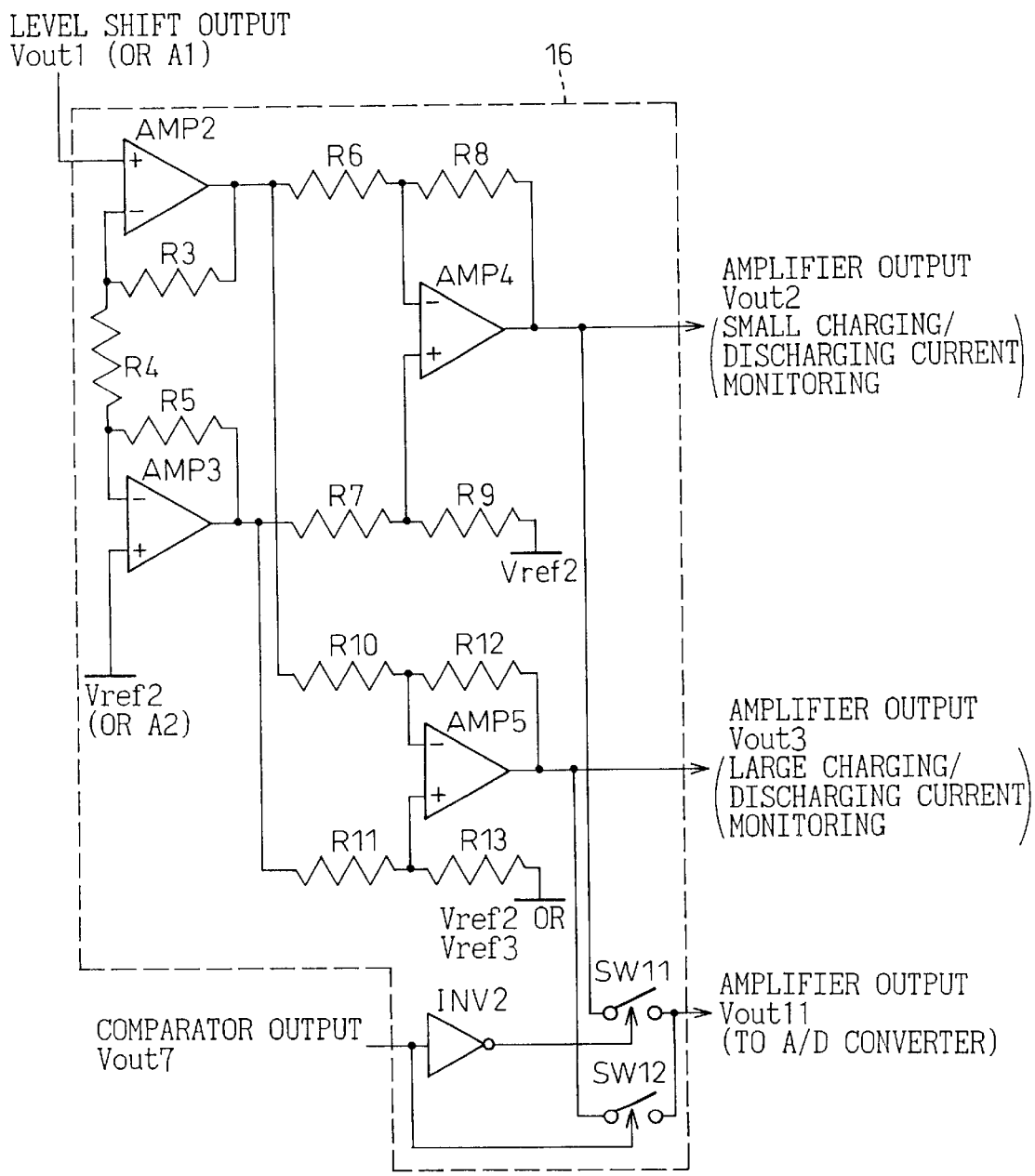
FIG. 4 is a diagram showing an example of structure of an amplifier.

FIG. 4 shows an example of structure of the amplifier 16 shown in FIG. 1. In FIG. 4, AMP2 to AMP5 denote operational amplifiers, R3 to R13 denote resistors, INV2 denote an inverter, and SW11 and SW12 denote switches constructed of transistors and the like.

In the amplifier 16 shown in FIG. 4, AMP2, AMP3 and AMP4 constitute a first instrumentation amplifier. The AMP2, AMP3 and AMP5 constitute a second instrumentation amplifier that shares a part of the circuit with the first instrumentation amplifier. When Vin represents a difference between an output voltage of the level shifter that is input to the AMP2 and Vref2 that is input to the AMP3, the respective amplifiers take outputs Vout2 and Vout3 as follows.

$$Vout2=R8/R6\ (1+2R3/R4)Vin+Vref2\ or\ Vref3$$

$$Vout3=R12/R10\ (1+2R3/R4)Vin+Vref2\ or\ Vref3$$

In the above expressions, the following relationship is maintained: R3=R5, R6=R7, R8=R9, R10=R11, and R12=R13.

To an output Vout11 of the amplifier 16, there is applied an output of Vout2 or Vout3 to be selected by the switches SW11 and SW12 that are controlled based on an output Vout7 of the comparator 17 to be described later.

Resistances of the resistors R3 to R13 shown in FIG. 4 are determined as follows, for example.

$$R3=R4=R5=R6=R7=R10=R11=10\ k\Omega$$

$$R8=R9=50\ k\Omega$$

$$R12=R13=12.5\ k\Omega$$

It is assumed that the reference voltage Vref2 is 2.5 V, and Vref2 is supplied to the AMP5. In this case, the amplification degree (1+2R3/R4) relating to the operational amplifiers AMP2 and AMP3 is 3. The amplification degree (R8/R6) relating to the operational amplifier AMP4 is 5. The amplification degree (R12/R10) relating to the operational amplifier AMP5 is 1.25. The output Vout2 of the amplifier 16 for monitoring the small charging/discharging current takes the following range: Vout2=4 V (at 2.5A during charging) to 1 V (at 2.5A during discharging). The output Vout3 of the amplifier 16 for monitoring the large charging/discharging current takes the following range: Vout3=4 V (at 10A during charging) to 1 V (at 10A during discharging).

Instead of using Vref2 as the reference voltage to be supplied to the AMP5, it is also possible to use Vref3 that is output from a controller shown in FIG. 7, and to change the resistance so that the amplification degree (R12/R10) of the AMP5 becomes 2.5. Based on this arrangement, it is possible to measure each of a charging current and a discharging current within a full range of the A/D converter. In the controller shown in FIG. 7, SW1 and SW2 for determining Vref3 are controlled by the output Vout4 of the comparator. As described later, Vout4 is high during charging, and low during discharging. Therefore, Vref3 becomes 1.0 V during charging, and 4.0 V during discharging. As a result, Vout3 takes the following range during charging.

Vout3=4 V (at 10A during charging) to 1 V (0A)

Vout3 takes the following range during discharging.

Vout3=4 V (at 0A) to 1 V (at 10A during discharging)

Thus, it is possible to measure each of a charging current and a discharging current within a full range of 1 V to 4 V of the A/D converter.

Figure 5:
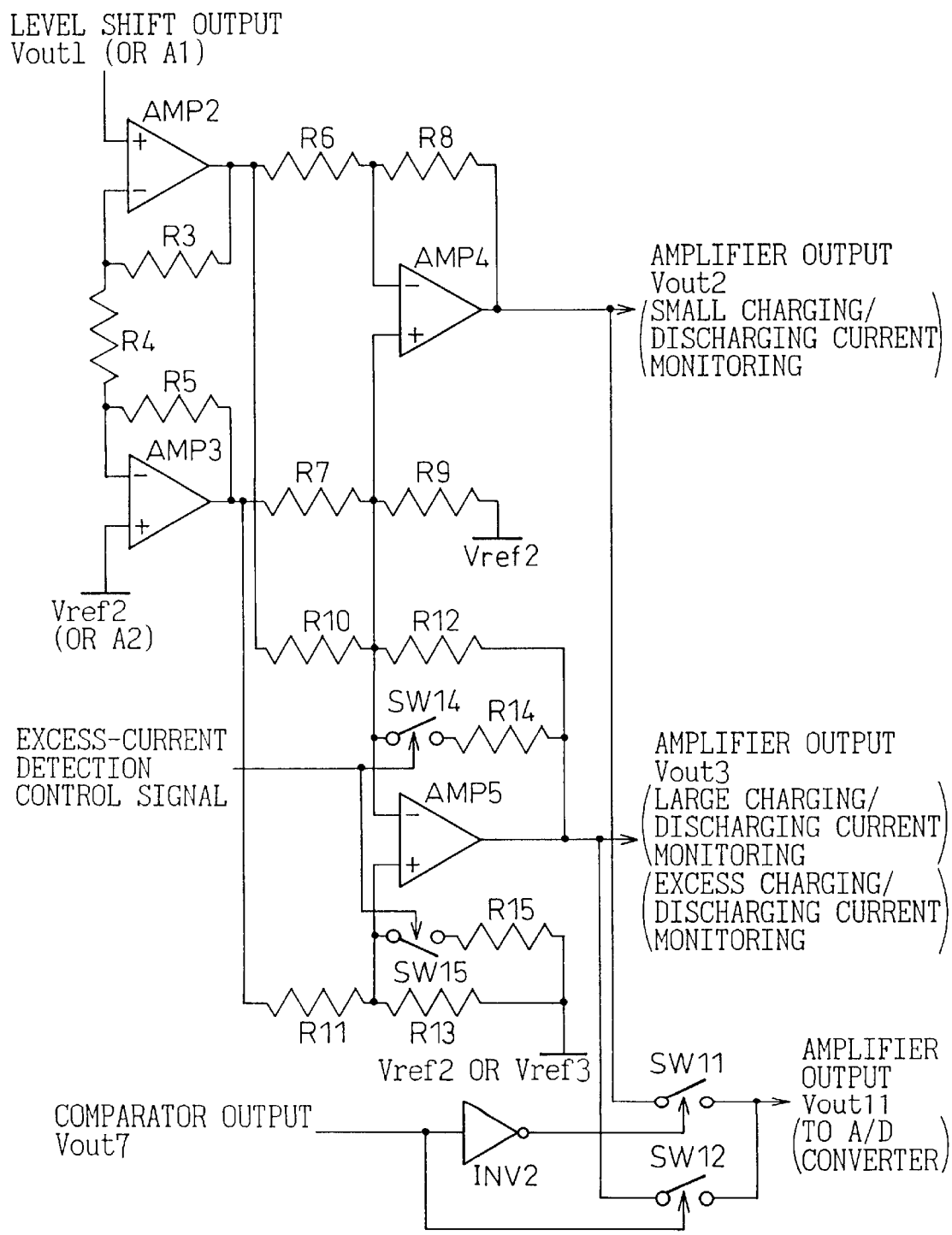
FIG. 5 is a diagram showing another example of structure of the amplifier.

FIG. 5 is a diagram showing another example of structure of the amplifier 16 shown in FIG. 1. This shows an addition of an excess current detection function to the circuit shown in FIG. 4, to make it possible to measure an excess charging/discharging current as well. The amplifier shown in FIG. 5 includes switches SW14 and SW15 to be opened or closed according to an excess-current detection control signal, and resistors R14 and R15 to be connected in parallel to the resistors R12 and R13 respectively via the switches SW14 and SW15, in addition to the construction of the amplifier shown in FIG. 4.

During the normal monitoring of a large charging/discharging current, the switches SW14 and S15 are in a non-conductive state. When it has been detected that a current is outside the large charging/discharging current monitoring range, the switches SW14 and SW15 become conductive, and the resistors R12 and R14 are connected together in parallel and the resistors R13 and R15 are connected together in parallel. Based on this parallel connection, resistances become smaller than the resistances of the original resistors R12 and R13. Therefore, when the switches SW14 and SW15 are in the conductive state, the amplification degree relating to the operation amplifier AMP5 becomes smaller than the amplification degree in the non-conductive state. As a result, it becomes possible to detect a current larger than the current during the monitoring of a large charging/discharging current. In other words, it becomes possible to detect an excess current.

Figure 6:
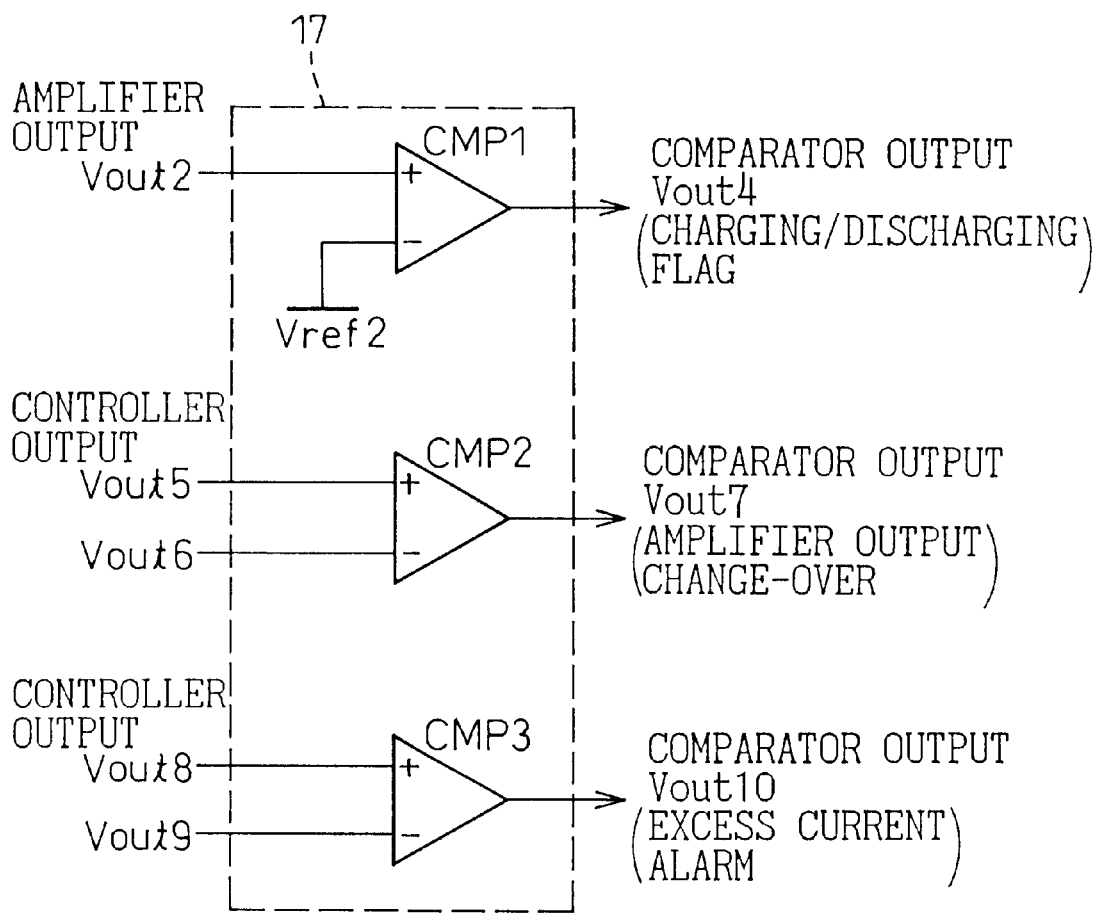
FIG. 6 is a diagram showing an example of structure of a comparator.

FIG. 6 shows an example of a structure of the comparator 17 shown in FIG. 1. The comparator 17 has three comparators CMP1 to CMP3. The comparator CMP1 compares the output Vout2 with the reference voltage Vref2 of 2.5 V, for example, and outputs a result of the comparison as Vout4. This output Vout4 is a charging/discharging flag that shows whether a secondary battery is in a charging state or in a discharging state. When the output Vout4 is high, this shows that the secondary battery is in the charging state, and when the output Vout4 is low, this shows that the secondary battery is in the discharging state.

The comparator CMP2 compares an output Vout5 with an output Vout6 of the controller 11 to be described later, and outputs an amplifier output change-over signal Vout7 for opening and closing the switches SW11 and SW12 shown in FIG. 4 and FIG. 5.

The comparator CMP3 compares an output Vout8 with an output Vout9 of the controller 11 to be described later, and outputs a signal Vout10 for generating an excess current alarm.

FIG. 7 shows an example of a structure of the controller 11 shown in FIG. 1. In FIG. 7, SW3 to SW10 denote switches, INV1 denotes an inverter, and AND denotes an AND circuit. The controller 11 changes outputs Vout5, Vout6, Vout8 and Vout9 to be supplied to the comparator 17, and changes Vref3, with the switches SW1 to SW10 in the circuit shown in FIG. 7.

An example of the operation of the comparator 17 and the controller 11 will be explained below based on an example shown in FIG. 8. The outputs Vout5 and Vout6 to be input to the comparator 17 are determined as shown in FIG. 8(A). During a charging period, the charging/discharging flag Vout4 is H (High). Therefore, the switch SW3 is ON, the switch SW4 is OFF, the switch SW5 is OFF, and the switch SW6 is ON. As a result, the output Vout2 of the amplifier for monitoring a small charging/discharging current is output as the Vout5, and 4.0 V is output as the Vout6. On the other hand, during a discharging period, the charging/discharging flag Vout4 is L (Low). Therefore, the switch SW3 is OFF, the switch SW4 is ON, the switch SW5 is ON, and the switch SW6 is OFF. As a result, 1.0 V is output as the Vout5, and the output Vout2 of the amplifier for monitoring a small charging/discharging current is output as the Vout6.

Vout7 of the amplifier output change-over signal that is output from the comparator 17 is determined as shown in FIG. 8(B). As the charging current is less than 2.5 A, the output Vout2 is lower than 4.0 V. During a small charging period, a relationship between Vout5 and Vout6 is Vout2 (=Vout5)<4.0 V (=Vout6). Therefore, Vout7 becomes L. As the charging current is more than 2.5 A, the output Vout2 is higher than 4.0 V. During a large charging period, a relationship between Vout5 and Vout6 is Vout2 (=Vout5)>4.0 V (=Vout6). Therefore, Vout7 becomes H. As the charging current is less than 2.5 A, the output Vout2 is higher than 1.0 V. During a small discharging period, a relationship between Vout5 and Vout6 is 1.0 V (=Vout5)<Vout2 (=Vout6). Therefore, Vout7 becomes L. As the discharging current is more than 2.5 A, the output Vout2 is lower than 1.0 V. During a large discharging period, a relationship between Vout5 and Vout6 is 1.0 V (=Vout5)>Vout2 (=Vout6). Therefore, Vout7 becomes H.

Vout8 and Vout9 that are input to the comparator17 are determined as shown in FIG. 8(C). During a charging, the switch SW7 and SW10 are ON, and the switches SW8 and SW9 are OFF. Therefore, Vout3 is output to the output Vout8, and 4.0 V is output to the output Vout9. As the charging current is more than 10A, Vout3 is higher than 4.0 V. Therefore, when the comparator output Vout10 is H, an excess-charging current alarm OCC_ALM is output. During a discharging, the switches SW7 and SW10 are OFF, and the switches SW8 and SW9 are ON. Therefore, 1.0 V is output to the output Vout8, and Vout3 is output to the output Vout9. As the discharging current is more than 10 A, Vout3 becomes lower than 1.0 V. Therefore, when the comparator output Vout10 is H, an excess-discharging current alarm ODC_ALM is output.

As explained above, the same pair of reference voltages (1.0 V, 4.0 V) are used for changing current modes between the small current/large current modes and for detecting an excess current. The pair of reference voltages (1.0 V, 4.0 V) are also used as Vref3. Based on the common use of these reference voltages, it is possible to reduce the circuit scale of the reference voltage generator 10.

FIG. 9 is an explanatory diagram of the A/D converter 18 and the numerical-value converter 19 shown in FIG. 1. The numerical-value converter 19 converts an output voltage of the A/D converter 18 into a numerical value corresponding to a charging/discharging current.

Based on the above-described set values, a relationship between a voltage applied to the A/D converter 18 and a charging/discharging current during a monitoring of a small charging/discharging current, a large charging current and a large discharging current becomes as shown in FIG. 9(A).

As shown in FIG. 9(A), the input voltage of the A/D converter 18 becomes 4.0 V when a current is charged at 2.5 A by a small charging/discharging current, when a current is charged at 10 A by a large charging current, and when a large discharging current is 0 A. Further, the input voltage of the A/D converter 18 becomes 2.5 V when a small charging/discharging current is 0 A, when a current is charged at 5 A by a large charging current, and when a large discharging current is 5 A. Further, the input voltage of the A/D converter 18 becomes 1.0 V when a current is discharged at 2.5 A by a small charging/discharging current, when a large charging current is 0 A, and when a current is discharged at 10 A by a large discharging current.

FIG. 9(B) shows an example where the A/D converter 18 outputs these voltages in 8-bit digital values. The numerical-value converter 19 converts the 8-bit digital values as outputs of the A/D converter 18 into 9-bit digital values as shown in FIG. 9(C) based on Vout4 as a charging/discharging flag and Vout7 as amplifier output change-over signal. As a result of the conversion, Vout4 becomes an MSB (Most Significant Bit).

FIG. 10 is a flowchart showing a method of conversion by the numerical-value converter 19. First, the numerical-value converter 19 inputs an output of the A/D converter 18 (S20). When the amplifier output change-over signal Vout7 is H (S21), the numerical-value converter 19 outputs a result of the conversion as D9_D8D7 - - - D1 (S22). D9 of an MSB is Vout4. D8D7 - - - D1 is an 8-bit output from the A/D converter 18.

When the amplifier output change-over signal Vout7 is L and also when the charging/discharging flag Vout4 is H (S23), the numerical-value converter 19 outputs a result of the conversion as D9_E9E9_D7D6 - - - D2 (S24). E9 is an inverted value of D9. Further, when the amplifier output change-over signal Vout7 is L and also when the charging/discharging flag Vout4 is L (S23), the numerical-value converter 19 outputs a result of the conversion as D9_E9E9_E7E6 - - - D2 (S25). E7E9 - - - E2 is a 1's complement of D7D6 - - - D2.

Figure 11:
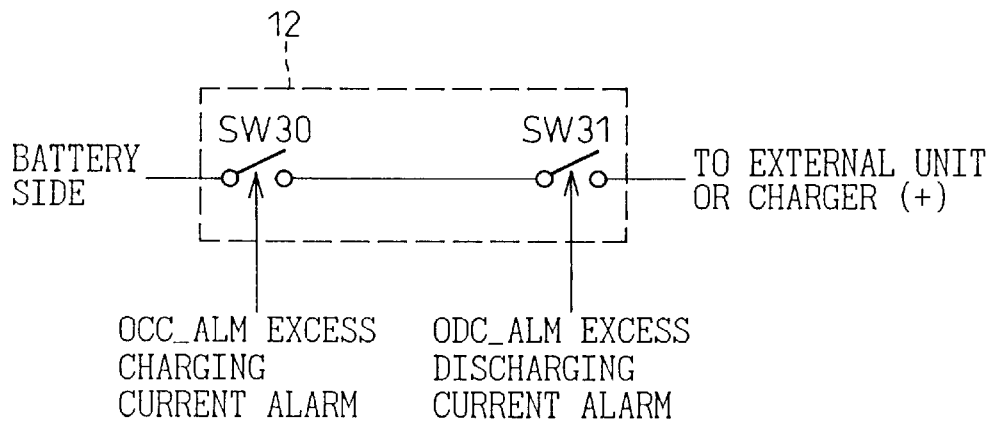
FIG. 11 is a diagram showing an example of structure of a switch.

FIG. 11 shows an example of structure of the switch 12 shown in FIG. 1. The switch 12 includes switches SW30 and SW31 for disconnecting an external charger or external units that consume power from the battery 13, based on the excess charging current alarm OCC_ALM and the excess discharging current alarm ODC_ALM that are output from the controller 11.

The chattering remover 20 for removing the chattering of the outputs (Vout4/Vout7/Vout10) of the comparator 17 will be explained next. This chattering remover 20 may be installed inside the comparator 17.

Figure 12:
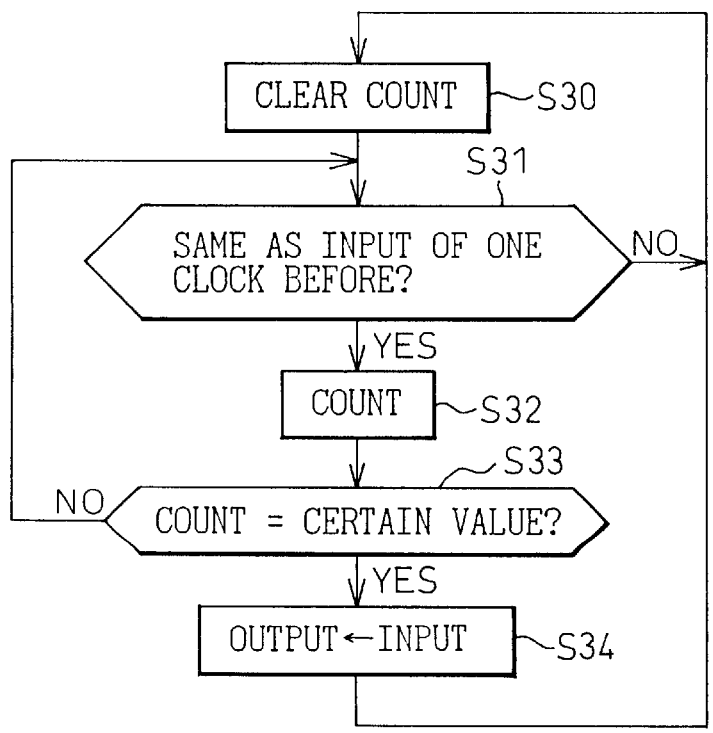
FIG. 12 is a flowchart showing a principle of the operation of a chattering remover.

FIG. 12 is a flowchart showing a principle of the operation of the chattering remover 20. First, the chattering remover 20 clears its counter value (count number) (S30). Next, the chattering remover 20 checks whether or not the input that is an output of the comparator is the same value as the input of one clock before (S31). When the value is different, the chattering remover 20 returns to the step S30, and clears the count value. When the input is the same value as the input of one clock before, the chattering remover 20 counts (that is, increments the counter value by one) (S32). The chattering remover 20 repeats the steps S31 and S32 until when the count value reaches a predetermined value (S33). When the count value has reached the predetermined value, the chattering remover 20 reflects the input from the comparator 17 in the output of the chattering remover 20.

Figure 13:
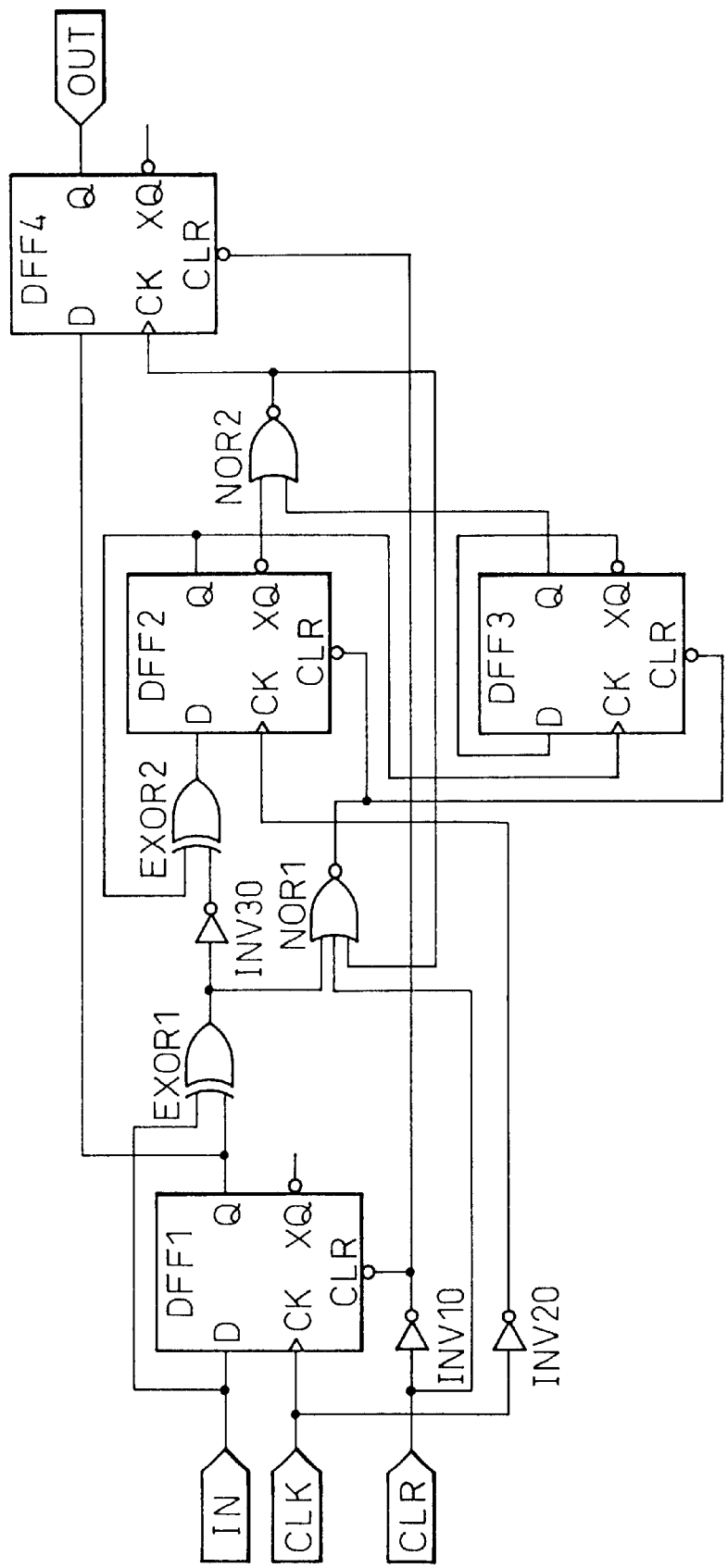
FIG. 13 is a diagram showing an example of a circuit structure of the chattering remover.

FIG. 13 shows an example of a circuit structure of the chattering remover 20. In FIG. 13, DFF1 to DFF4 denote D-type flip-flops, INV10 to INV30 denote inverters, EXOR1 and EXOR2 denote exclusive OR circuits, and NOR1 and NOR2 denote NOR circuits. IN and OUT denote an input signal and an output signal of the chattering remover 20 respectively. CLK and CLR denote a clock signal and a clear signal of the chattering remover 20 respectively.

A counter clear operation is carried out when the clear signal CLR is H (High). The flip-flops DFF1 to DFF3 are cleared when a CLR terminal of each flip-flop is L (Low). The flip-flops DFF1 to DFF3 operate in synchronism with a rising edge of a signal that is input to a CK terminal. The flip-flop DFF1 maintains a signal of one clock before, and the exclusive OR circuit EXOR1 compares a current input signal IN with the input signal of one clock before held by the flip-flop DFF1.

The exclusive OR circuit EXOR2 and the flip-flops DFF2 and DFF3 constitute a 2-bit counter. This 2-bit counter starts counting when the input signal of one clock before that is held by the flip-flop DFF1 is equal to the current input signal IN.

The NOR circuit NOR2 has a function of monitoring an output of the 2-bit counter. When a counter value has become a predetermined value, the NOR circuit NOR2 generates a clock signal of the flip-flop DFF4, and generates a counter clear signal. The NOR circuit NOR1 generates a clear signal of the 2-bit counter. The counter is cleared when the clear signal CLR of this circuit is H, or when the input signal of one clock before that is held by the flip-flop DFF1 is different from the current input signal IN, or when the 2-bit counter has counted up to a certain threshold value.

The flip-flop DFF4 takes in and holds an input signal when the counter has counted up to a certain value (that is, after a lapse of a certain period of time during which there is no change in the input signal IN).

Figure 14:
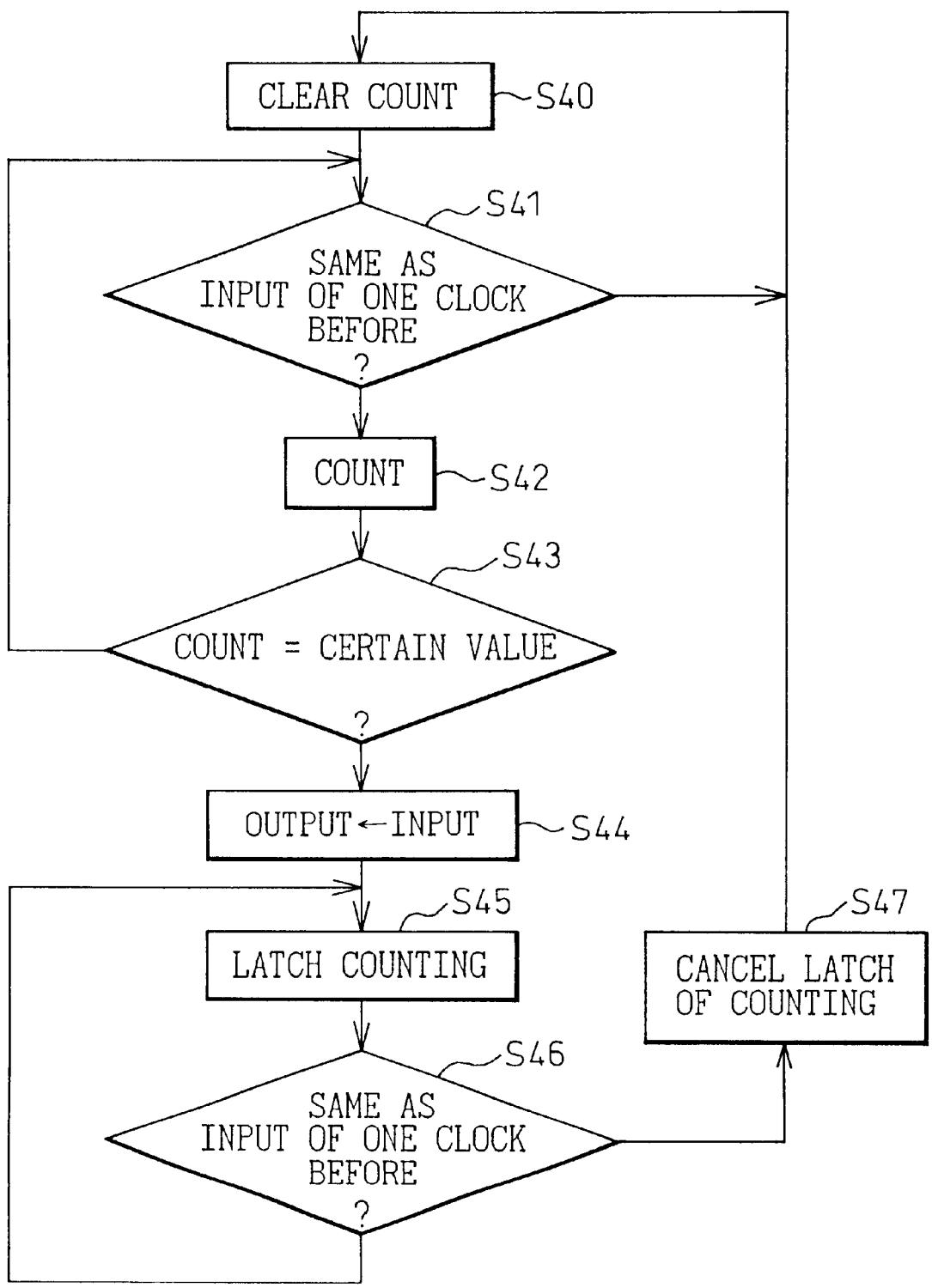
FIG. 14 is an operation principle of an improved chattering remover.

FIG. 14 shows an operation flow of the chattering remover 20 that has been improved to reduce power consumption of the chattering remover 20. The operation at steps S40 to S44 is similar to the above-described operation at the steps S30 to S34 shown in FIG. 12. An input to the chattering remover 20 that is an output of the comparator 17 is reflected in an output of the chattering remover 20 (S44). Thereafter, the counting operation is latched to stop the counting (S45) until when there is a change in the output of the comparator 14 that is input to the chattering remover 20 (S46). When there has been a change in the output of the comparator 17, the chattering remover 20 cancels the latched counting operation (S47), and clears the count (S40). This operation is repeated.

When the chattering remover 20 is provided with a setter for setting a clock frequency or a count threshold value, it is possible to change the clock frequency or the count threshold value. This makes it possible to change the setting of an invalid period and to optimize the adjustment. It is also possible to easily construct a chattering remover 20 with a different length of an invalid period in the same circuit structure. Therefore, the circuit can be used in common.

FIG. 15 is a total block diagram showing one example of a battery pack to which the present invention is applied. A battery pack 21 is used as a power source of a portable information terminal or the like. In FIG. 15, a current monitoring circuit 22 is the same as that shown in FIG. 1. In FIG. 15, portions attached with the same reference numbers as those in FIG. 1 denote like portions shown in FIG. 1. A voltage monitoring circuit 23 is a circuit for measuring a voltage of a power source 13. An MPU 24 is a microprocessor that manages the whole battery pack 21 and that posts a state of battery remaining capacity of the battery pack 21 to the portable information terminal or the like that is the main device, based on a result of measurement of a current by the current monitoring circuit 22 and a result of measurement of a voltage by the voltage monitoring circuit 23. The voltage monitoring circuit 23 can be constructed by a conventional known circuit, and therefore, a detailed description of this circuit will be omitted.

What is claimed is:

1. A current monitoring circuit for a secondary battery, comprising:

a current detector detecting a current during a charging and a discharging of a secondary battery, and outputting a voltage signal according to a detected current;

an amplifier having an amplification degree that can be changed, and amplifying the voltage signal output from the current detector at a suitable amplification degree obtained by changing the amplification degree;

an A/D converter converting an output of the amplifier into a digital signal; and a numerical-value converter converting the digital signal output from the A/D converter according to an amplification degree of the amplifier, to thereby output a digital value indicating the current during the charging and the discharging of the secondary battery.

2. The current monitoring circuit according to claim 1, wherein the amplifier comprises:

a first amplifier amplifying an output of the current detector at a first amplification degree;

a second amplifier sharing a part of a circuit with the first amplifier, and amplifying the output of the current detector at a second amplification degree smaller than the first amplification degree;

a first switch selecting one of outputs of the first and second amplifiers as the output of the amplifier; and a first comparator comparing an output of the first amplifier with a first reference voltage, wherein the first switch is controlled based on a result of the comparison by the first comparator.

3. The current monitoring circuit according to claim 2, wherein the first reference voltage includes an upper limit value and a lower limit value, the current monitoring circuit further comprising;

a second comparator for comparing an output of the first amplifier with a second reference voltage to make a decision as to whether a current is being charged or being discharged; and a second switch selectively supplying the upper limit value of 4.0 V and the output of the first amplifier to the first comparator during a charging, and selectively supplying the output of the first amplifier and the lower limit value of 1.0 V to the first comparator during a discharging.

4. The current monitoring circuit according to claim 3, further comprising:

a third switch selecting the lower limit value during a charging and selecting the upper limit value during a discharging and supplying the selected values to the second amplifier as a reference value, to thereby adapt an output range of the second amplifier to an input range of the A/D converter for each of a charging current and a discharging current.

5. The current monitoring circuit according to claim 3, further comprising:

a third comparator comparing the output of the second amplifier with the first reference voltage, to thereby detect an excess current; and a fourth switch selectively supplying the output of the second amplifier and the upper limit value of to the third comparator during a charging, and selectively supplying the lower limited value of and the output of the second amplifier to the third comparator during a discharging.

6. The current monitoring circuit according to claim 5, further comprising:

a chattering remover firming up a result of a comparison of each of the first, second and third comparators when an output of each comparator is unchanged during a predetermined period of time.

7. The current monitoring circuit according to claim 3, wherein the first reference voltage includes an upper limit value of 4.0 V.

8. The current monitoring circuit according to claim 3, wherein the first reference voltage includes a lower limit value of 1.0 V.

* * * * *